United States Patent [19]
Swanson

[11] Patent Number: 5,309,114
[45] Date of Patent: May 3, 1994

[54] PULSE STEP MODULATOR
[75] Inventor: Hilmer I. Swanson, Quincy, Ill.
[73] Assignee: Harris Corporation, Melbourne, Fla.
[21] Appl. No.: 86,183
[22] Filed: Jun. 30, 1993
[51] Int. Cl.$^5$ .............................................. H03F 3/38
[52] U.S. Cl. ........................................ 330/10; 455/108
[58] Field of Search ................. 330/10, 207 A, 207 P, 330/251, 297, 298; 332/149; 455/108, 117

[56] References Cited
U.S. PATENT DOCUMENTS

| | | | |
|---|---|---|---|
| 4,403,197 | 9/1983 | Swanson | 330/10 |
| 4,560,944 | 12/1985 | Furrer | 330/10 |
| 4,725,788 | 2/1988 | Lodahl | 330/10 |
| 4,745,368 | 5/1988 | Lodahl | 330/10 |

Primary Examiner—Steven Mottola
Attorney, Agent, or Firm—Tarolli, Sundheim & Covell

[57] ABSTRACT

A pulse step modulator (PSM) is disclosed herein and having particular use in AM radio broadcasting. This modulator includes a plurality of series connected unit step voltage modules each including a DC voltage source and an associated actuatable switch for, when actuated, turning on the associated module to provide a unit step voltage of a given magnitude. An output circuit is connected to the modules for providing an output voltage to a load wherein the magnitude of the output voltage is a multiple of a unit step voltage in dependence upon the number of modules that are turned on. Each module exhibits the characteristic of dissipating heat when the module is turned on with the amount of heat dissipated being a function of the time duration that the module is turned on. Thermal loading of the modules is equalized by thermally coupling selected ones of the modules together as a group with the modules of each group being selected such that the average amount of heat being dissipated by each group is essentially equalized.

13 Claims, 4 Drawing Sheets

PULSE STEP MODULATOR

TECHNICAL FIELD

This invention relates to the art of modulators and more particularly to pulse step modulators which are particularly applicable for use in AM radio broadcasting systems.

BACKGROUND OF THE INVENTION

In AM radio broadcasting in the medium-wave and short-wave bands, a high-power vacuum tube is conventionally used in the final radio frequency amplifier stage of the transmitter. For maximum power-amplification efficiency, this tube is not operated as a linear amplifier, but rather as a class C or class D biased circuit, producing an RF envelope which follows that of the B+ DC supply voltage provided to the tube anode. Thus, modulation of the RF signal is achieved through varying the B+ DC supply to the plate anode of the tube. The high-powered audio amplification circuitry required to vary this voltage is referred to in the art as the modulator.

Recently, a modulator to achieve the foregoing has been employed in the art and is known as a pulse step modulator (PSM). Such a pulse step modulator is disclosed in my U.S. Pat. No. 4,403,197. Briefly, a pulse step modulator (PSM) as disclosed in that patent includes a plurality of series connected unit step modules each of which includes an isolated DC voltage source, a remotely controlled switch and a series diode. The switch in each module may be remotely controlled to turn the module on or off. As each module is turned on, it provides a step voltage. As the various modules are turned on in a stepwise fashion, the output voltage will increase in steps from 0 volts to a maximum voltage with the maximum equalling the sum of all of the module DC voltage sources. A lowpass filter at the output may be employed for removing switching noise. An encoder or the like monitors a time varying input signal, such as an audio signal, and turns on one of the unit step modules for each incremental increase in the value of the audio signal. As the audio signal continues to increase in value, the modules are turned on one at a time in a given order. Similarly, as the audio signal decreases in value, the modules are sequentially turned off in the reverse order.

As noted above, when a pulse step modulator is employed in an AM transmitter, the number of modules that are turned on varies with modulation, i.e., the magnitude of the audio signal. Some modules are on almost all of the time. They only turn off at the negative peak of modulation. Some modules are off most of the time, as they only turn on at the positive peak of modulation. Therefore, there is a large difference in the average dissipation at the various modules that are required for such a pulse step modulator. That is, if such a pulse step modulator has 46 unit step modules, then unit step module 1 will have the largest amount of heat dissipation because it is turned on most of the time, whereas unit step module 46 will have very little heat dissipation because the module is turned on very seldom. This causes a large difference between these two modules. Thus, the heat dissipated by the various modules is unequal.

In an attempt to equalize the loading of the various modules in such a pulse step modulator, the prior art has included a first on-first off system employing a monitor which monitors the operation of the various modules. As the input signal increases in magnitude, the module that has been turned off the longest will be the first to be turned on. Conversely, as the input signal decreases, the module that has been turned on the longest will be the first to be turned off. Such a system is disclosed in the U.S. Pat. No. to A. Furrer 4,560,944. This first on-first off system requires a monitoring circuit for monitoring the operation of various modules and, hence, this may add to the cost of such a system.

SUMMARY OF THE INVENTION

The present invention is directed to minimizing dissipation by the unit step modules in a pulse step modulator without employing a monitoring circuit as noted from the prior art.

The present invention contemplates the provision of a pulse step modulator which employs a plurality of series connected unit step modules with each module including a DC voltage source and an actuatable switch for, when actuated, turning the module on to provide a unit step voltage of a given value. An output circuit is connected to the modules for providing an output voltage to a load and wherein the output voltage is a multiple of the unit step voltage in dependence upon the number of modules that are turned on. As the input signal increases in value, the modules are sequentially turned on in a given order and are turned off in the reverse order as the input signal decreases in value. Each incremental change in magnitude of the input signal results in a corresponding turn on or turn off of one of the modules. Each unit step module exhibits the characteristic of dissipating heat when it is turned on with the amount of heat dissipated being a function of the time duration that the module is turned on. In accordance with the present invention, the thermal loading of the unit step modules is equalized by thermally coupling selected ones of the modules together as a group with the modules of each group being selected such that the average amount of heat dissipated by each group is equalized.

BRIEF DESCRIPTION OF THE DRAWINGS

The foregoing and other objects and advantages of the present invention will become more readily apparent from the following description as taken in conjunction with the accompanying drawings, wherein.

DESCRIPTION OF PREFERRED EMBODIMENTS

Figure 1:
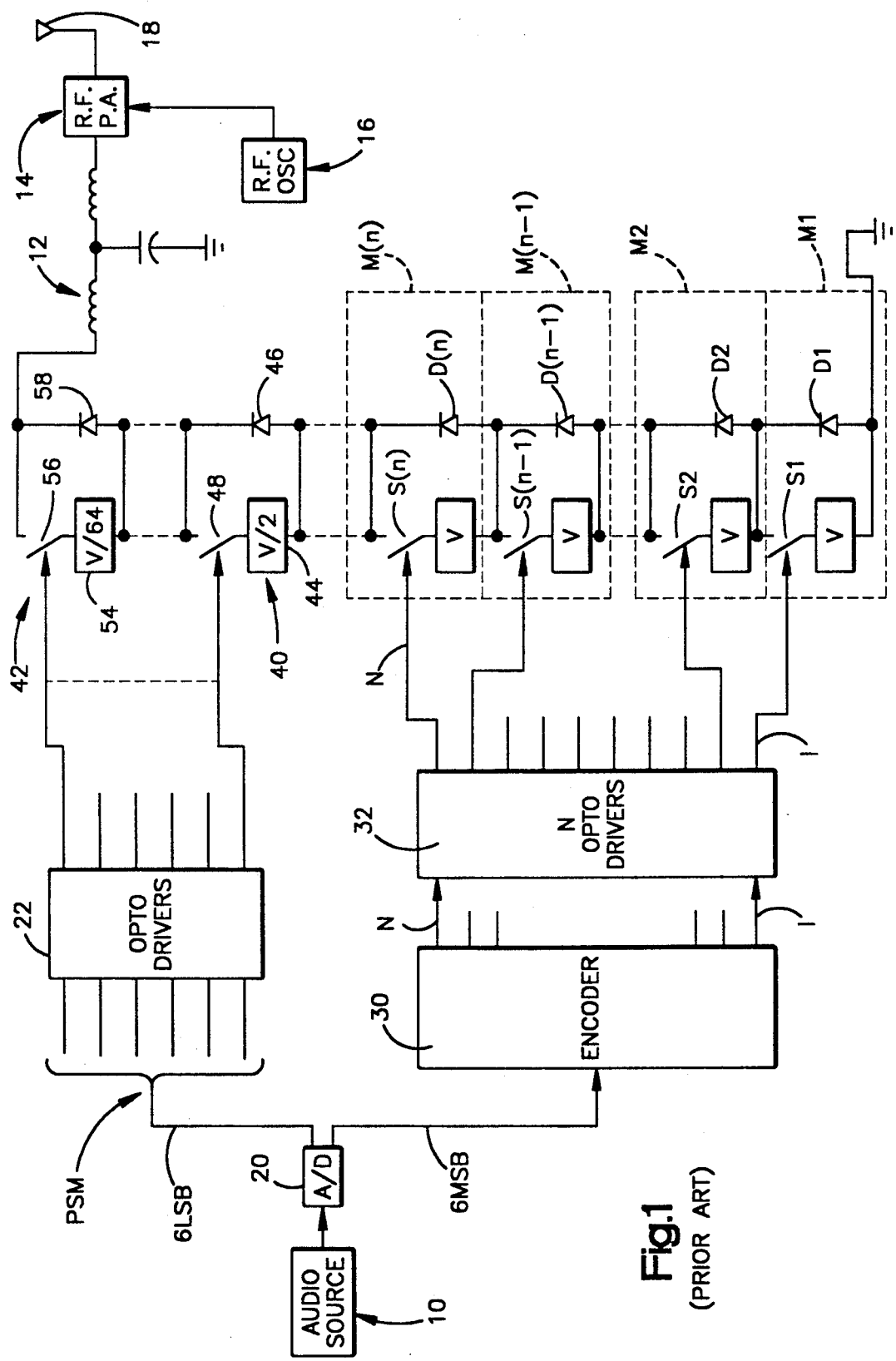
FIG. 1 is a schematic-block diagram illustration of a prior art AM broadcasting transmitter employing a pulse step modulator (PSM)

Reference is now made to the drawings wherein the showings are for purposes of illustrating preferred embodiments of the invention only and not for purposes of limiting the same. FIG. 1 illustrates an AM transmitter which incorporates a pulse step modulator (PSM). The transmitter includes an audio source which generates an amplitude and frequency varying audio signal which is to be amplified and transmitted. This signal is supplied to the pulse step modulator PSM, to be described in greater detail hereinafter, and which amplifies the signal to a high power level and provides a resulting amplitude signal $V_{out}$ to a lowpass filter 12. The resulting amplified and filtered signal is then supplied to the audio input of a conventional RF power amplifier 14 where it amplitude modulates an RF carrier signal supplied by an RF oscillator 16. The resulting AM signal is then transmitted by a conventional antenna 18.

The pulse step modulator (PSM) includes a conventional analog-to-digital converter 20 which receives the analog audio signal from the audio source 10 and converts it into a multibit digital representation thereof. In the embodiment illustrated, the analog input signal is converted into a 12 bit digital signal. The six least significant bits (6 LSB) are supplied to an optical driver 22. The optical driver has six output circuits which serve to turn on or off six switches which are respectively associated with six differently weighted voltage sources. These will be hereinafter referred to as the binary step voltage modules as opposed to the unit step voltage modules to be discussed in greater detail hereinbelow.

The six most significant bits (6 MSB) are supplied to an encoder 30 having N output circuits which are supplied to an optical driver circuit 32. Circuit 32 has N output circuits respectively connected to N unit step switches S1 through SN. Switches S1 through SN are respectively located in unit step modules M1 through M(N).

The encoder 30 sequentially energizes its output circuits 1 through N with incremental increases in the magnitude of the analog signal and de-energizes the output circuits in the reverse order with incremental decreases in the magnitude of the analog signal. These are reflected through the optical driver circuit 32. The optical driver circuit has output circuits 1 through N which serve to sequentially close switches S1 through SN as the analog input signal incrementally increases in magnitude and to sequentially open the switches, in the reverse order, as the input analog signal incrementally decreases in magnitude. Whenever a switch S1 through SN is open, the associated unit step module is turned off and whenever a switch is closed, the associated unit step module is turned on.

Figure 5:
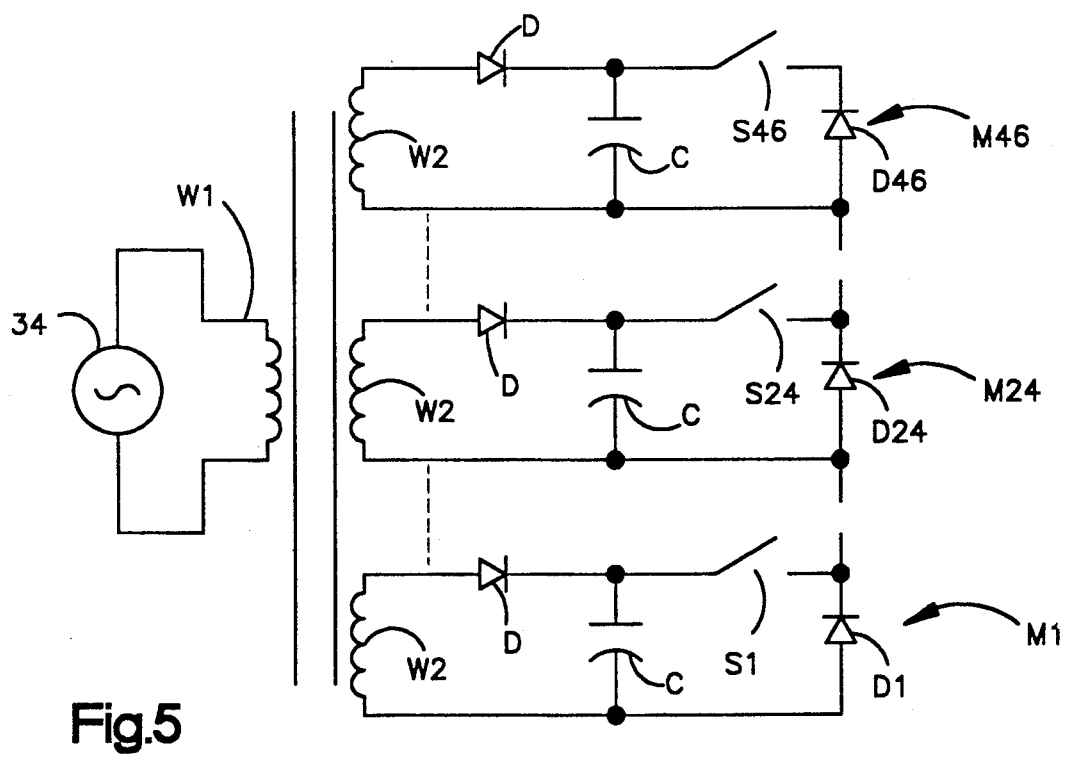
FIG. 5 is a schematic illustration representative of the electrical circuitry employed for each unit step module employed in practicing the invention.

Each unit step module M1 through M(N) includes an incremental unit step voltage source V, a switch such as switch S1 and a diode such as diode D1 all interconnected as shown with respect to module M1 in FIG. 1. The unit step modules are connected together in series with diodes D1 through D(N). Each incremental voltage source may be considered as a DC voltage source of a fixed magnitude which, in practice, may be on the order of 600 volts. FIG. 5 is a simplified schematic circuit diagram which shows three of these modules M1, M24 and M46. As in the case of module M1, each module includes a secondary winding W2 which is transformer coupled to a primary winding W1 connected across a suitable AC voltage source 34. Each module includes a rectifying circuit represented by a diode D and a storage-smoothing circuit represented by a capacitor C. The total voltage across the series connected modules is dependent upon the number of modules which have been turned on by closure of the associated switches S1 through S(N). For example, if all of the switches S1 through SN are closed, then all of the unit step voltage sources V are connected together in series and added together to provide an output voltage NV. If each unit step voltage source V has a value on the order of 600 volts and N is on the order of 50, then the total voltage may be on the order of 30,000 volts.

In the discussion presented above, reference is made to the unit step voltage sources V located in modules M1 through M(N). For finer resolution in providing an output signal, there is provided six binary step voltage sources connected to six output circuits of the optical driver circuit 22. Each is a fractional voltage source with all six adding up to approximately the value of a single unit step voltage source V (such as 600 volts). Two of the binary step voltage source modules 40 and 42 are illustrated in FIG. 1 with each module including a binary weighted fractional voltage source, a switch and a bypass diode. Thus, module 40 includes a fractional voltage source 44 which has a weight equal to one-half that of a unit step voltage V. Module 40 also includes a bypass diode 46 and a switch 48. Module 42 includes a binary weighted voltage source 54 which has a value equal to 1/64th of a unit step voltage source V. This voltage source 54 has associated therewith a switch 56 and a diode 58 interconnected as in the case of the other modules discussed hereinbefore. These fractional binary voltage source modules respectively represent fractional voltages $\frac{1}{2}V$, $\frac{1}{4}V$, $\frac{1}{8}V$, $1/16V$, $1/32V$ and $1/64V$. These will be turned on and off in a somewhat random fashion as the input voltage varies in magnitude between two voltage levels represented by two of the unit step sources. That is, if the input voltage has exceeded a level sufficient to turn on twenty of the unit step voltage sources but has not yet exceeded the level to turn on the next or twenty-first unit step voltage source, then during the interim period the fractional or binary voltage modules will turn on and off as the analog input voltage varies in magnitude between these two voltage levels.

The output voltage that will be supplied to the filtering circuit 12 will be the sum of all of the unit step voltage sources that have been turned on plus the sum of the binary voltage sources that have been turned on. The contribution by the binary sources will be somewhat random as noted above. However, the contribution by the various unit step voltage sources varies over time with increasing and decreasing values of the input signal. The unit step voltage sources associated with the lower values of the input analog signal are turned on the longest and the unit step voltage sources associated with the highest values of the input analog signal are turned on the shortest periods of time. Thus, the output circuits of encoder 30 are sequentially turned on in the order from circuit 1 through circuit N as the analog signal continuously increases in magnitude. The unit step module associated with circuit 1 is turned on for the longest time duration during a given operating period and the module associated with output circuit N will be on for the shortest time duration. The module associated with step 1 has a large amount of heat dissipation, whereas the module associated with step N has relatively little heat dissipation. This will cause a large difference in temperature between these two modules with resulting overloading and injury to the circuitry employed.

In the prior art, as shown in FIG. 1, module M1 is associated with step 1 and module M2 is associated with step 2 and so on, with module M(N) being associated with step N. Consequently, there is a large difference in the amount of heat dissipated by module M1 relative to that by module M(N) since the former is turned on most of the time and the latter is turned off most of the time. As discussed hereinbefore, each module includes a switch such as switch S1 in module M1. Each such switch preferably takes the form of a semiconductor switch such as an IGBT transistor switch. Such switches are designed to operate at various temperature levels but deteriorate when those levels are exceeded. For example, such transistors may operate properly at a silicon material temperature on the order of 100° C., but will deteriorate when the silicon material temperature exceeds a higher temperature, such as 120° C. As the power dissipated by a module increases, the temperature of the module increases. As successive modules are turned on, the current flowing through the series circuits including the transistor switches S1, S2, etc. will increase as the total voltage supplied to the filter circuit 12 increases. This further raises the power and, hence, the amount of heat dissipated by each of the unit step modules that are turned on. If this is not compensated for, the transistor switches S1 through S(N) will deteriorate and their operating lifetimes will be substantially shortened.

Figure 2:
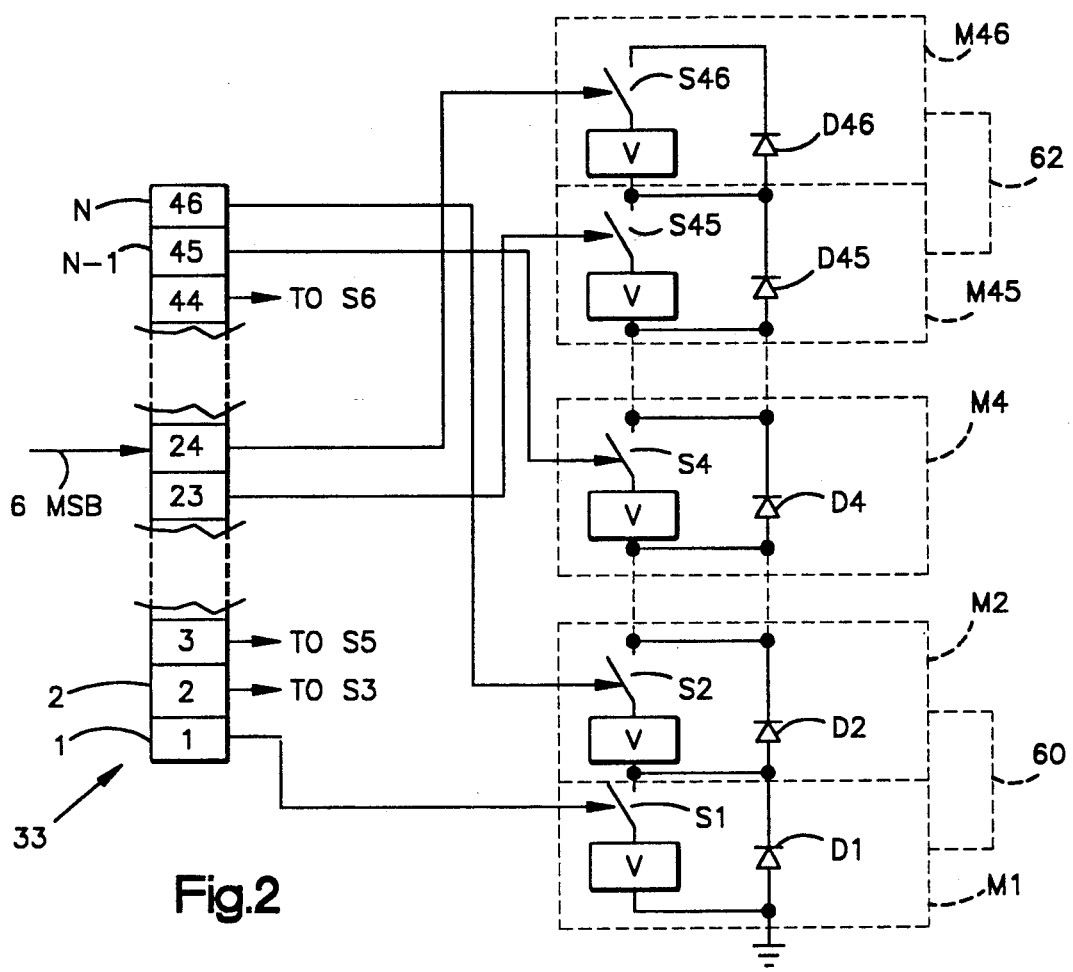
FIG. 2 is a schematic-block diagram illustration of a portion of the circuitry illustrated in FIG. 1 but arranged in accordance with the invention.

In accordance with one embodiment of the invention as set forth in FIG. 2, the unit step modules are divided into groups of two modules with the modules in each group being selected depending upon the amount of heat dissipated by each module so that with the modules thermally coupled together the average amount of heat dissipated by each group will be equalized. Thus, the module that is turned on the longest during an operating period is thermally coupled with the module that is turned on the shortest. The pairings of the other modules are made in the same fashion so that the heat dissipated by each pair is equalized. For example, if module 1 is turned on the longest and module 2 is turned on the shortest, then the former is the hottest module and the latter is the coldest module. By thermally coupling these two modules as with coupling 60 (FIG. 2), the amount of heat dissipated will be the average of that of the two modules. This will lower the operating temperature of switch S1 while increasing the operating temperature for switch S2. Since switch S2 is rarely turned on, this has no significance for that switch but has substantial significance for switch S1. By lowering the operating temperature for switch S1, a longer operating lifetime may be obtained. The remaining modules in the embodiment of FIG. 2 are grouped in the same manner.

In this embodiment, the encoding is changed from that shown in FIG. 1 with an encoder 33 (which is simplified by not showing the optical driver portion) and which serves to receive the six most significant bits of the analog input signal and provide enabling signals on its output step circuits 1 through N (where N=46 in the example being given) for incrementally increasing magnitudes. The output circuits are connected to module switches S1 to S46 so that only every other module is enabled until half of them are turned on. In the example given, the odd numbered modules are turned on first. Any further increase in magnitude of the input signal reverses the turn on direction. That is, the even numbered modules are then turned on but in the reverse order from module M46, M44 .... M4 and M2. The average loading between any two adjacent modules is equalized. If all of the unit step modules are arranged and numbered from 1 through 46 as indicated in FIG. 2, the turn on sequence for increasing magnitudes of the analog input signal is the following order: M1, M3, M5, M7, ... M43, M45, M46, M44, M42, ... M6, M4 and M2. Decreasing magnitudes would disable the modules in the reverse order.

In the embodiment of FIG. 2, the modules are arranged such that module M1 which is turned on the longest is located adjacent module M2 which is turned on the shortest. Thus, the hottest module is located adjacent the coldest module and the remaining modules ar similarly arranged. The paired modules are thermally coupled together. Thus, a thermal coupling 60 couples M1 and M2 and a similar coupling 62 couples modules M45 and M46.

Figure 3:
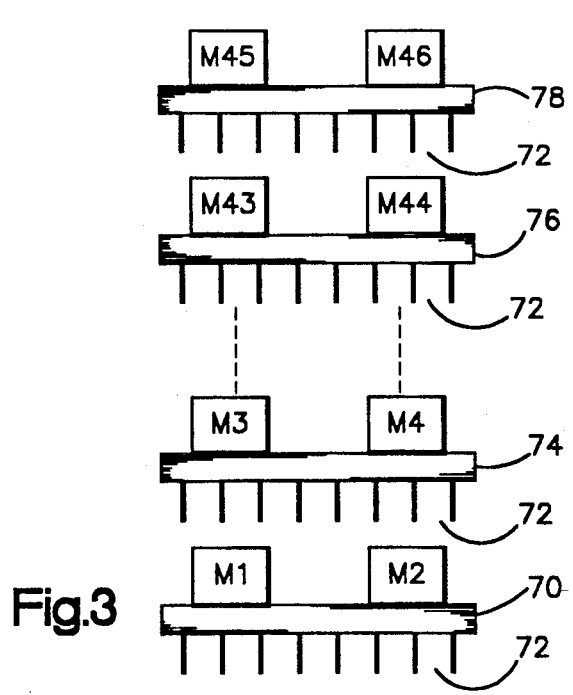
FIG. 3 is a schematic illustration showing the manner in which various modules are arranged on heat sinks in accordance with the present invention.

One way of thermally coupling the selected pairs of modules together is illustrated in FIG. 3. Here, physically adjacent modules M1 and M2 are thermally coupled together by a common metal heat sink 70 having a plurality of metal cooling fins 72 extending from the lower side thereof. The heat sink 70 may be twice as large as that needed to dissipate the heat from one of the unit step modules M1 through MN. In such case, the heat sink will be inadequate to dissipate the heat from module 1 which is the hottest module employed. However, since the hottest module M1 is thermally coupled by the heat sink to the coldest module M2, the heat sink need only be adequate to dissipate the average amount cf heat dissipated from a pair of modules. In a similar fashion, the remaining modules are grouped in pairs with each pair being selected so that the average heat dissipated by the pair is equal to that of each of the remaining pairs. Moreover, each pair or group is mounted on a common heat sink. Thus, modules 3 and 4, which represent the second hottest unit and the second coldest unit respectively, are mounted on a common heat sink 74 having cooling fins 72. In a similar manner, modules M43 and M44 are mounted on a common heat sink 76 having cooling fins 72 and modules M45 and M46 are mounted on a common heat sink 78 having cooling fins 72.

Figure 4:
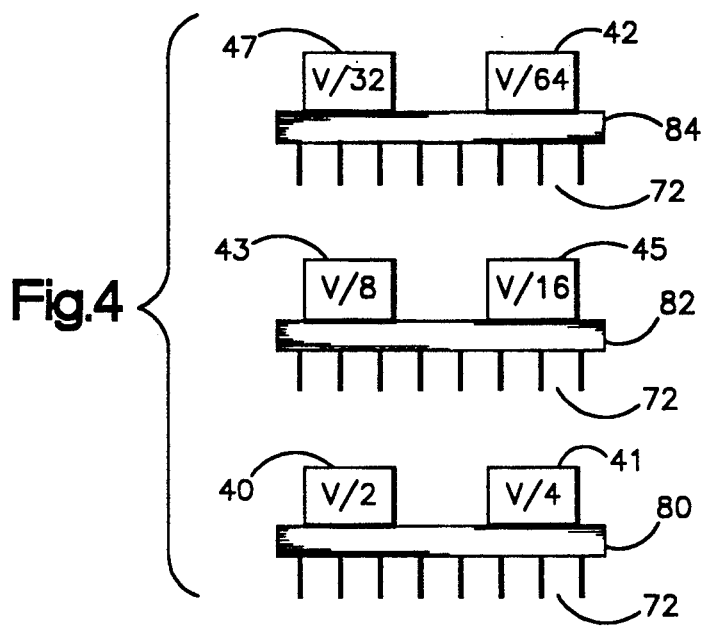
FIG. 4 is a view similar to that of FIG. 3 but showing binary step modules arranged on heat sinks in accordance with the present invention.

The fractional or binary voltage step modules may also be paired together with each pair being mounted on a common heat sink, as is shown in FIG. 4. Here, each module is labelled with its fractional contribution of the unit voltage V. Module 40 and module 41 are paired together and mounted on a common heat sink 80 having fins 72. Also, modules 43 and 45 are paired together and mounted on a common heat sink 82 having fins 72. Modules 47 and 42 are paired together and mounted on a common heat sink 84 having cooling fins 72. In practice, it has been found that these fractional or binary step modules will be turned on and off in a somewhat random fashion and, hence, each is turned on for approximately the same amount of time during a cycle of operation. Consequently, it is believed the pairing of these modules is not critical in the pairing relationships.

Figure 6:
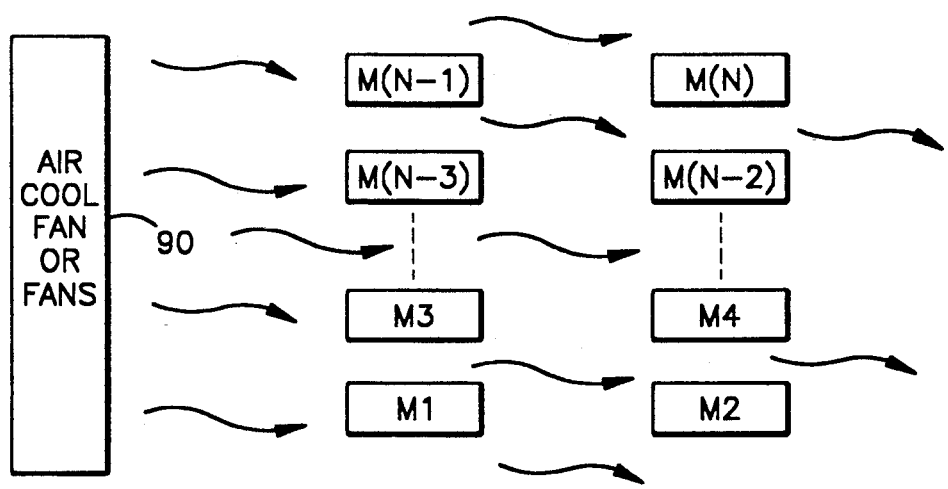
FIG. 6 is a schematic illustration illustrating a second embodiment showing the arrangement of the various unit step modules in accordance with the present invention.

Reference is now made to FIG. 6 which shows another embodiment of the invention wherein the unit step modules are arranged in pairs in the same manner as set forth in FIG. 3 but instead of thermally coupling each pair of modules with a common heat sink, each pair of modules is thermally coupled by the cooling breeze from air cooling means 90. The air cooling mans 90 may take the form of a single fan for all of the modules aligned in pairs or may include a single fan for each pair of modules. In this arrangement, the hotter module of each pair is located on the left, closest to the source of the cooling air, whereas the colder module of each pair is located to the right so that the cooling breeze first passes the hotter module and then passes the colder module.

Figure 7:
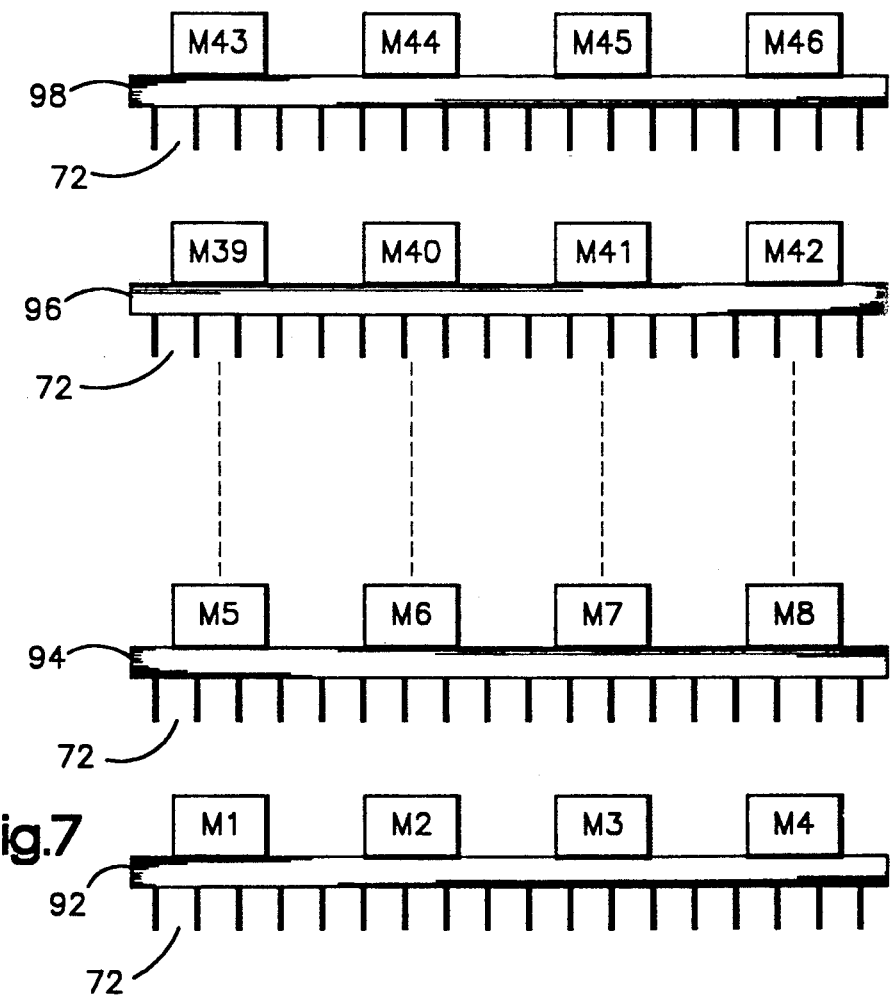
FIG. 7 is a schematic illustration showing a third embodiment showing the arrangement of the various unit step modules in accordance with the present invention.

A still further embodiment of the invention is illustrated in FIG. 7 wherein each group of thermally coupled modules includes more than two modules, such as three or four modules or more modules. In the embodiment shown in FIG. 7, each group of thermally coupled modules includes four modules. As in the other embodiments, each group is selected so that the average temperature loading or heat dissipated for each group is essentially equal. For example, with forty-six modules arranged as set forth in FIG. 2, the lower group of modules may include modules M1, M2, M3 and M4 all mounted on a common heat sink 92 having cooling fins 72 extending from one side thereof. Similarly, modules M5, M6, M7 and M8 may be mounted on another heat sink 94 having cooling fins 72 extending therefrom. This progression may continue with the next to the top group of modules including modules M39, M40, M41 and M42 all mounted on a common module 96 having cooling fins 72 extending therefrom. The uppermost group in this embodiment includes modules M43, M44, M45 and M46 all mounted on a common heat sink 98 having a plurality of cooling fins 72 extending therefrom. Other variations in the size of each group may be made providing that the average heat dissipated by each of the groups is essentially equal.

Although the invention has been described in conjunction with preferred embodiments, it is to be appreciated that various modifications may be made without departing from the spirit and scope of the invention as defined by the appended claims.

Having described the invention, the following is claimed:

1. A pulse step modulator comprising:
a plurality of series connected unit step modules each including a DC voltage source and an associated actuatable switching means for, when actuated, turning on said associated module to provide a unit step voltage of a given magnitude;
an output circuit connected to said modules for providing an output voltage to a load wherein the magnitude of said output voltage is a multiple of said unit step voltage in dependence upon the number of said modules that are turned on;
each said module exhibiting the characteristic of dissipating heat when turned on with the amount of heat dissipated being a function of the time duration that said module is turned on; and,
means for equalizing the thermal loading of said modules including means for thermally coupling selected ones of said modules together as a group with the said modules of each said group being selected such that the average amount of heat dissipated by each said group is essentially equalized.

2. A pulse step modulator as set forth in claim 1, wherein each said group includes the same number of said modules.

3. A pulse step modulator as set forth in claim 1 wherein said equalizing means includes a plurality of heat sinks corresponding in number with the number of said groups and wherein all of said modules in a said group are mounted on a common one of said heat sinks.

4. A pulse step modulator as set forth in claim 3 wherein each said group includes the same number of said modules.

5. A pulse step modulator as set forth in claim 1, wherein said equalizing means includes means for directing cooling air to flow past each said module of each said group.

6. A pulse step modulator as set forth in claim 5 wherein the said modules in each said group are arranged such that said module that dissipates the greatest amount of heat is cooled by said cooling air before that of said module that dissipates the least amount of heat within said group.

7. A pulse step modulator as set forth in claim 6 wherein each said group includes the same number of said modules.

8. A method of amplifying an analog frequency signal comprising the steps of:
providing a plurality of unit step modules connected together in series with each module including a DC voltage source and an associated actuatable switching means for, when actuated, turning on said associated module for providing a unit step voltage of a given magnitude;
connecting an output circuit to the modules for providing an output voltage to a load wherein the output voltage is a multiple of the unit step voltage in dependence upon the number of the modules that are turned on;
receiving a said analog signal and responding to the magnitude thereof for sequentially actuating the plurality of switching means in a given order as the magnitude of the input signal increases in value by incremental fixed steps and sequentially de-actuating the switch means in the reverse order as the input signal decreases in value by incremental fixed steps;
each of said modules exhibiting the characteristic of dissipating heat when turned on with the amount of heat dissipated being a function of the time duration that the module is turned on; and,
equalizing the thermal loading of the modules by thermally coupling selected ones of said modules together as a group of modules with the selected modules of each said group being selected such that the average amount of heat dissipated by each said group is essentially equalized.

9. A method as set forth in claim 8 including the step of selecting said modules for each said group so that each said group includes the same number of said modules.

10. A method as set forth in claim 8 wherein said step of equalizing includes providing a plurality of heat sinks with the number of heat sinks corresponding with the number of said groups of said modules and wherein all of said modules in a said group are mounted on a common one of said heat sinks.

11. A method as set forth in claim 10 wherein said step of equalizing includes providing each of said groups with the same number of said modules.

12. A method as set forth in claim 8 wherein said step of equalizing includes directing cooling air so as to flow past each of said modules of each of said groups.

13. A method as set forth in claim 11 including the step of arranging the modules in each said group so that the module that dissipates the greatest amount of heat is cooled by said cooling air before that of the module that dissipates the least amount of heat.

* * * * *